(12) United States Patent
Matsunaga et al.

(10) Patent No.: US 7,105,905 B2
(45) Date of Patent: Sep. 12, 2006

(54) THIN FILM TRANSISTOR, TFT SUBSTRATE AND LIQUID CRYSTAL DISPLAY UNIT

(75) Inventors: Naoki Matsunaga, Tokyo (JP); Kenji Sera, Tokyo (JP)

(73) Assignee: NEC Corporation, Tokyo (JP)

( * ) Notice: Subject to any disclaimer, the term of this patent is extended or adjusted under 35 U.S.C. 154(b) by 175 days.

(21) Appl. No.: 10/724,040

(22) Filed: Dec. 1, 2003

(65) Prior Publication Data

US 2004/0149989 A1    Aug. 5, 2004

(30) Foreign Application Priority Data

Jan. 31, 2003  (JP)  ............................. 2003-024473

(51) Int. Cl.
*H01L 29/04*  (2006.01)
*G02F 1/136*  (2006.01)

(52) U.S. Cl. ................. 257/435; 257/59; 257/E31.122; 349/44

(58) Field of Classification Search ................ 257/435, 257/59; H01L 29/04
See application file for complete search history.

(56) References Cited

U.S. PATENT DOCUMENTS

| 6,818,921 B1* | 11/2004 | Yasukawa ..................... 257/59 |
| 6,912,020 B1* | 6/2005 | Kawata ........................ 349/44 |
| 2002/0071072 A1* | 6/2002 | Ohtani et al. ............... 349/110 |
| 2003/0025848 A1* | 2/2003 | Sera et al. ..................... 349/43 |

FOREIGN PATENT DOCUMENTS

| JP | 11-84422 A | 3/1999 |
| JP | 11-204587 A | 7/1999 |

* cited by examiner

*Primary Examiner*—David Nelms
*Assistant Examiner*—Dao H. Nguyen
(74) *Attorney, Agent, or Firm*—Sughrue Mion, PLLC

(57) ABSTRACT

A thin film transistor is provided including an active layer, in which a source region and drain region are formed, a first light-shielding film shielding a light incident on the active layer, and a second light-shielding film between the active layer and the first shielding film. A carrier concentration of at least surface portion of the second light-shielding film which opposes the active layer is about $10^{17}/cm^3$ or less.

17 Claims, 12 Drawing Sheets

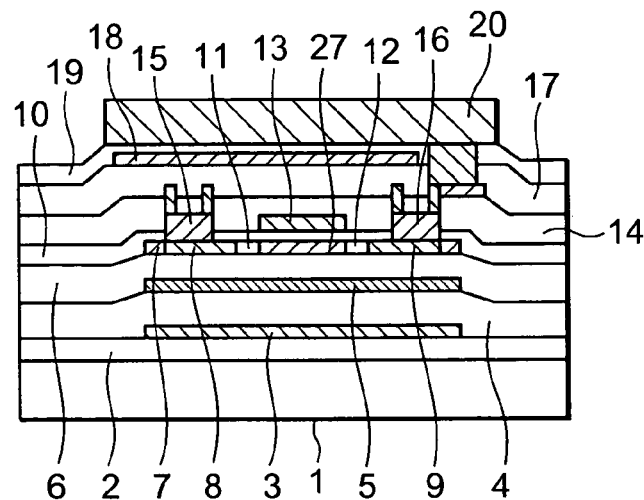
Fig. 6(a)
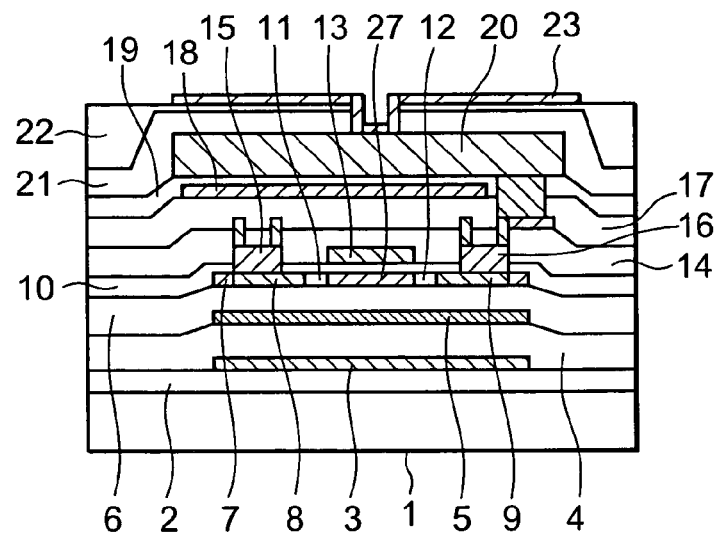
Fig. 6(b)
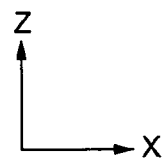

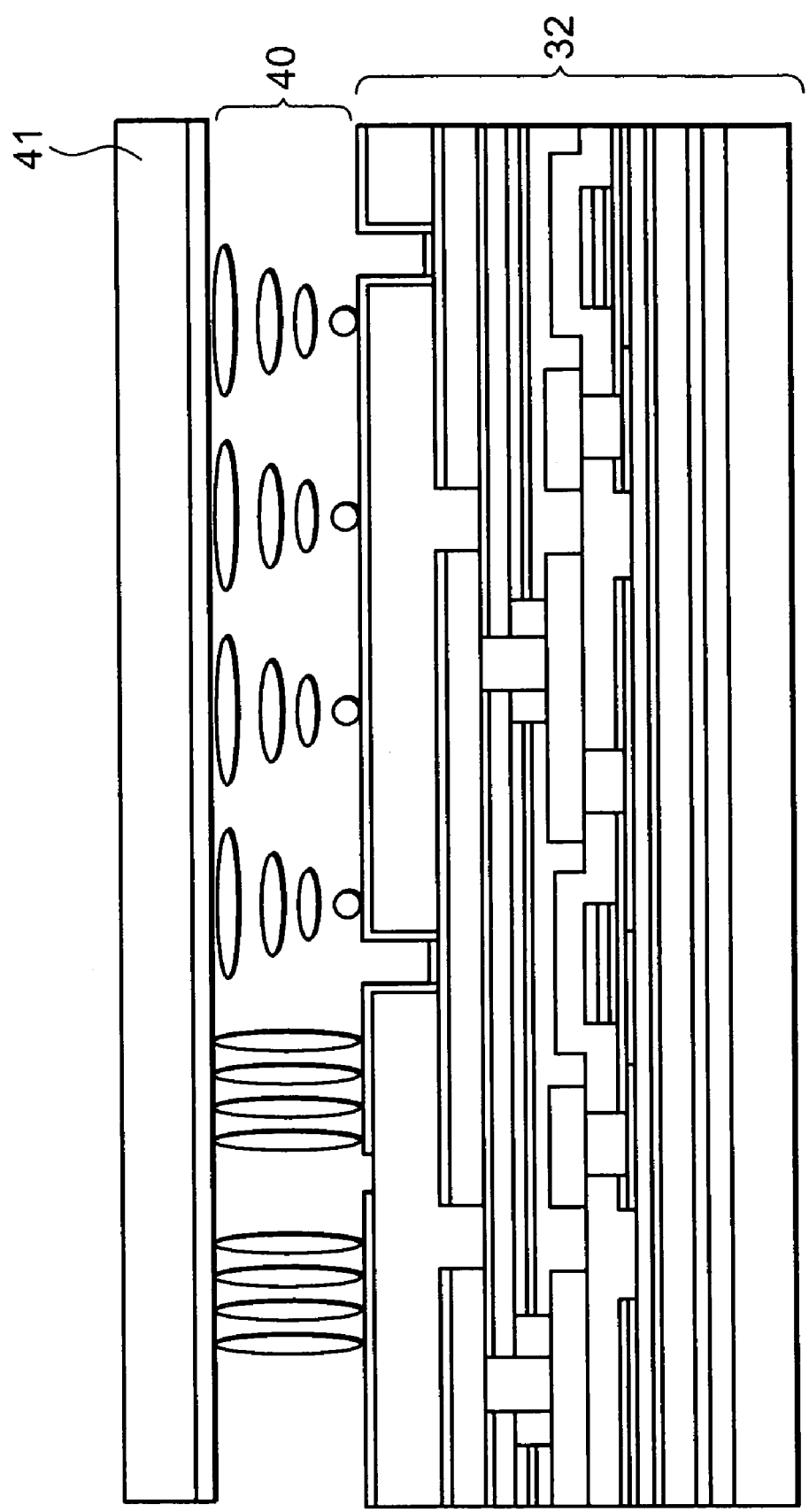

THIN FILM TRANSISTOR, TFT SUBSTRATE AND LIQUID CRYSTAL DISPLAY UNIT

BACKGROUND OF THE INVENTION

1. Field of the Invention

The present invention relates to a thin film transistor device, a liquid crystal display unit and a manufacturing method for the same, and more particularly, to a thin film transistor device and a liquid crystal display unit which reduces leakage current of a thin film transistor device.

2. Description of the Related Art

In recent years, as a display unit for OA (Office Automation) equipment, various display units using a liquid crystal display unit have been developed. Among various liquid crystal display units, an active matrix type liquid crystal display unit having a thin film transistor (TFT) used as a switching element, has an advantage over conventional displays in that contrast or response speed is not lower much even when the number of scanning lines is increased. For this reason, for high-grade display units for OA equipment and display units for high definition TVs, active matrix type liquid crystal display unit are often used. Also, when an active matrix type liquid crystal display unit has been used as a light valve for a projection-type display unit such as a projector, there is an advantage that large-screen displays can be easily obtained.

When the liquid crystal display unit is used as a light valve of a projection type display unit, the liquid crystal display unit is arranged between a light source and an optical system for projecting light from the light source. At this time, the liquid crystal display unit is arranged in such a manner that the light source is located on the side of an opposite substrate of the liquid crystal display unit and the optical system is located on the side of the thin film semiconductor device array substrate (TFT substrate) of the liquid crystal display unit. Among light with comparatively high luminance that becomes incident from the light source, the liquid crystal display unit controls intensity of the light that transmits through the optical system side on the basis of screen information. More specifically, the liquid crystal display unit switching-drives the thin film transistor and controls an electric field to be applied to the liquid crystal layer for each pixel to change the transmission factor of each pixel and thereby adjusting intensity of the transmitted light. The light that is transmitted by the liquid crystal display unit is enlarged and projected through the optical system having a lens and the like.

Normally, in the active matrix type liquid crystal display unit, a semiconductor layer such as amorphous silicon and polysilicon is used as an active layer of the thin film transistor. When light becomes incident on this active layer, leakage current (light-induced leakage current) due to optical excitation occurs so that the display performance of the liquid crystal display unit is deteriorated because the contrast becomes lower. Particularly when the active matrix type liquid crystal display unit is used as a light valve of the projection-type display unit, since light with high luminance becomes incident on the liquid crystal display unit, an influence due to light-induced leakage current that occurs becomes great. Also, in this case, since in the liquid crystal display unit, not only the light from the light source, but also light reflected by an optical system for projection becomes incident on the active layer of the thin film transistor, the influence due to the light-induced leakage current becomes even greater. In recent years, miniaturization and higher luminance of the projection type display unit has advanced, and the luminance of light that becomes incident on the liquid crystal display unit to be used as the light valve has increased as well. For this reason, the problem of light leakage current has become more serious.

As a technique for reducing the influence due to the light-induced leakage current, for example, Japanese Patent published application 11-204587A and 11-084422A describe a technique for reducing the quantity of light by intercepting return light that becomes incident on the thin film transistor. FIG. 1 shows a cross-section of such a conventional liquid crystal display unit. A pixel portion of this liquid crystal display unit has a first polysilicon film 452a, a siliside film 452b, a second polysilicon film 453, a dielectric film 454, which have been stacked in order on a substrate 451, and a thin film transistor 456 formed thereon.

The substrate 451 is made of, for example, a quartz substrate or a high strain point glass substrate. The first polysilicon film 452a and the siliside film 452b constitute the first light-shielding film 452. The first polysilicon film 452a is formed at a film thickness of about 50 nm on the substrate 451. The siliside film 452b is made of tungsten (W) that is a high-melting metallic material, and is formed at a film thickness of, for example, about 100 nm on the first polysilicon film 452a. The second polysilicon film 453 is constituted as the second light-shielding film, and is formed at film thickness of about 50 nm on the first light-shielding film 452. The dielectric film 454 is formed at a film thickness of about 380 nm on the entire surface of the substrate 451 on the second polysilicon film 453. The thin film transistor 456 includes the polysilicon layer 455 formed on the dielectric film 454 at film thickness of about 65 nm as the active layer, and is fabricated by a similar method to an ordinary fabrication method for thin film transistor for liquid crystal display units.

In the conventional liquid crystal display unit shown in FIG. 1, due to a stacked film composed of the first light-shielding film 452 and the second light-shielding film 453, light that becomes incident on the polysilicon layer (active layer of thin film transistor) 455 is intercepted. In the first light-shielding film 452, light that becomes incident on the active layer 455 of the thin film transistor 456 from the substrate back surface side is intercepted by the siliside film 452b that has a strong optical reflection property. Also, the second light-shielding film 453 consisting of polysilicon film which has a photo-absorption property absorbs the light that has entered between the first light-shielding film 452 and the active layer 455, that could not be intercepted by the siliside film 452b, and reduces the light that becomes incident on the active layer 455.

In the conventional liquid crystal display unit shown in FIG. 1, the dielectric film 454 is formed at film thickness of about 380 nm. In this case, among light that is reflected by the substrate 451 to return, light to be included in an angular difference β between a critical ray of light L11 and a critical ray of light L12 that are shown in FIG. 1 becomes incident on a channel region directly below the gate electrode of the active layer 455. Particularly when a strength of light from the light source increases, the light-shielding effect for the light that is reflected by the substrate 451 to return becomes insufficient even by the second polysilicon film 453 having photo-absorption property. When light becomes incident on a channel region of the active layer 455, light-induced leakage current occurs on the thin film transistor 456 and deteriorates the performance of the liquid crystal display unit. For this reason, particularly when the liquid crystal display unit is used as a light valve of a projection type display unit, a technique for more effectively shielding the light that becomes incident on the active layer 455 of a thin film transistor is needed.

SUMMARY OF THE INVENTION

The present invention provides a liquid crystal display unit using a thin film transistor, a TFT substrate and a liquid crystal display unit which reduces light-induced leakage current of the thin film transistor by reducing light incident on a channel region of the thin film transistor, and reduces an influence of the light-shielding film which has an electrical effect on the active layer of the thin film transistor.

According to a first embodiment of the present invention, a thin film transistor comprises an active layer, in which a source region and drain region are formed, a first light-shielding film shielding a light incident on the active layer, and a second light-shielding film between the active layer and the first light-shielding film, wherein a carrier concentration of at least surface portion of the second light-shielding film which opposes to the active layer is about $10^{17}/cm^3$ or less.

According to a second embodiment of the present invention, a thin film transistor comprises an active layer, in which a source region and drain region are formed, a first light-shielding film shielding a light incident on the active layer, and a second light-shielding film between the active layer and the first light-shielding film, wherein an electric field intensity of a surface portion of the second light-shielding film which opposes the active layer includes about 80% or less of that of the surface portion which opposes the first light-shielding film.

According to a third aspect of the present invention, a thin film transistor substrate comprises a light transmitting substrate, a transistor array including a plurality of thin film transistors disposed on the light transmitting substrate, a first light-shielding film disposed between the light transmission substrate and at least one of the thin film transistors, and a second light-shielding film between the first light-shielding film and an active layer of the thin film transistor, wherein a carrier concentration of a surface portion of the second light-shielding film which opposes the active layer is about $10^{17}/cm^3$ or less.

BRIEF DESCRIPTION OF THE DRAWINGS

FIGS. 6(a) and 6(b) are cross-sectional views showing a method for thin film transistor array substrate subsequent to FIG. 5(b).

FIG. 14 is a cross-sectional view showing a cross-sectional structure of a liquid crystal display according to a sixth embodiment of the present invention.

DETAILED DESCRIPTION OF THE INVENTION

Figure 2:
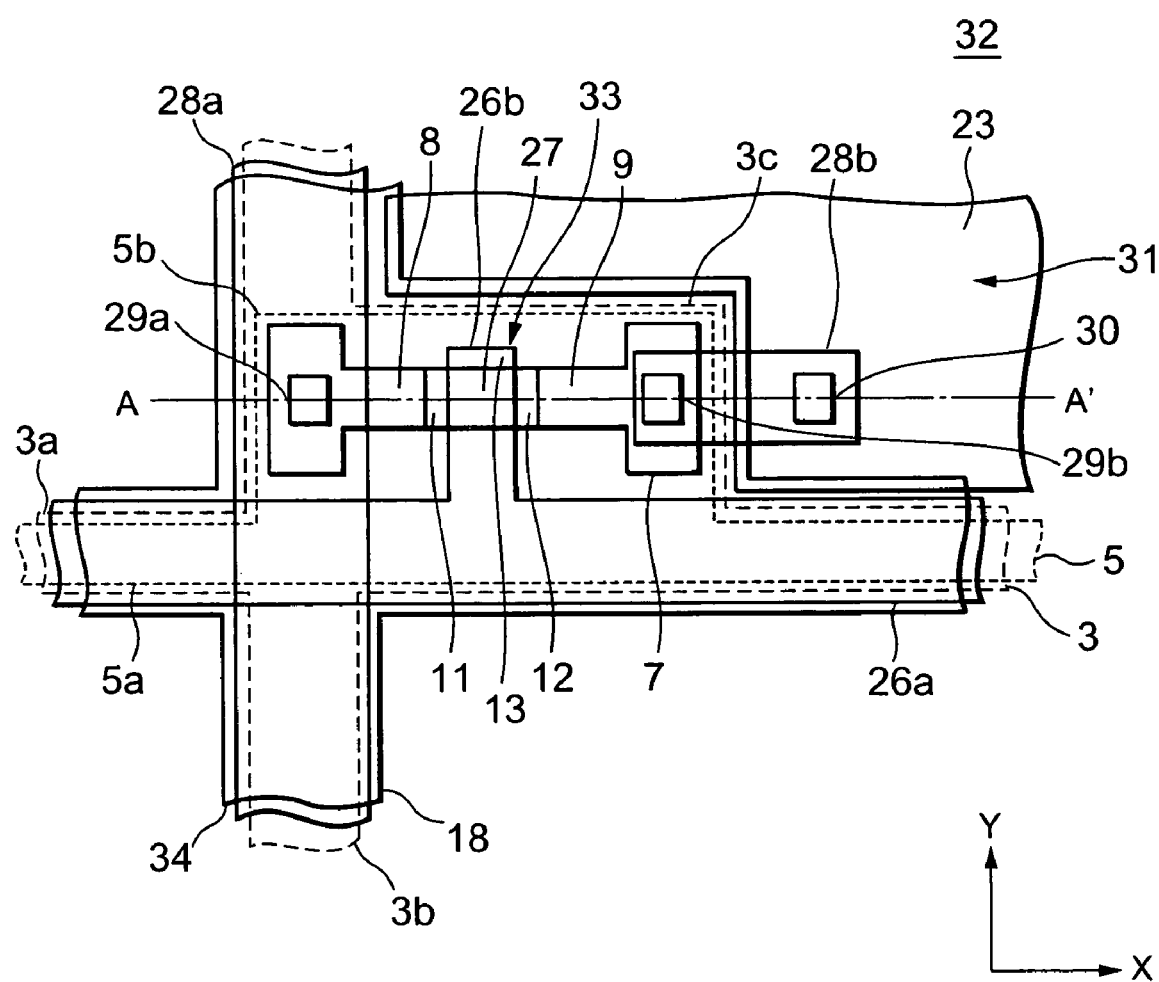
FIG. 2 is a plan view showing the vicinity of a thin film transistor of a thin film transistor array substrate according to a first embodiment of the present invention.
Figure 3:
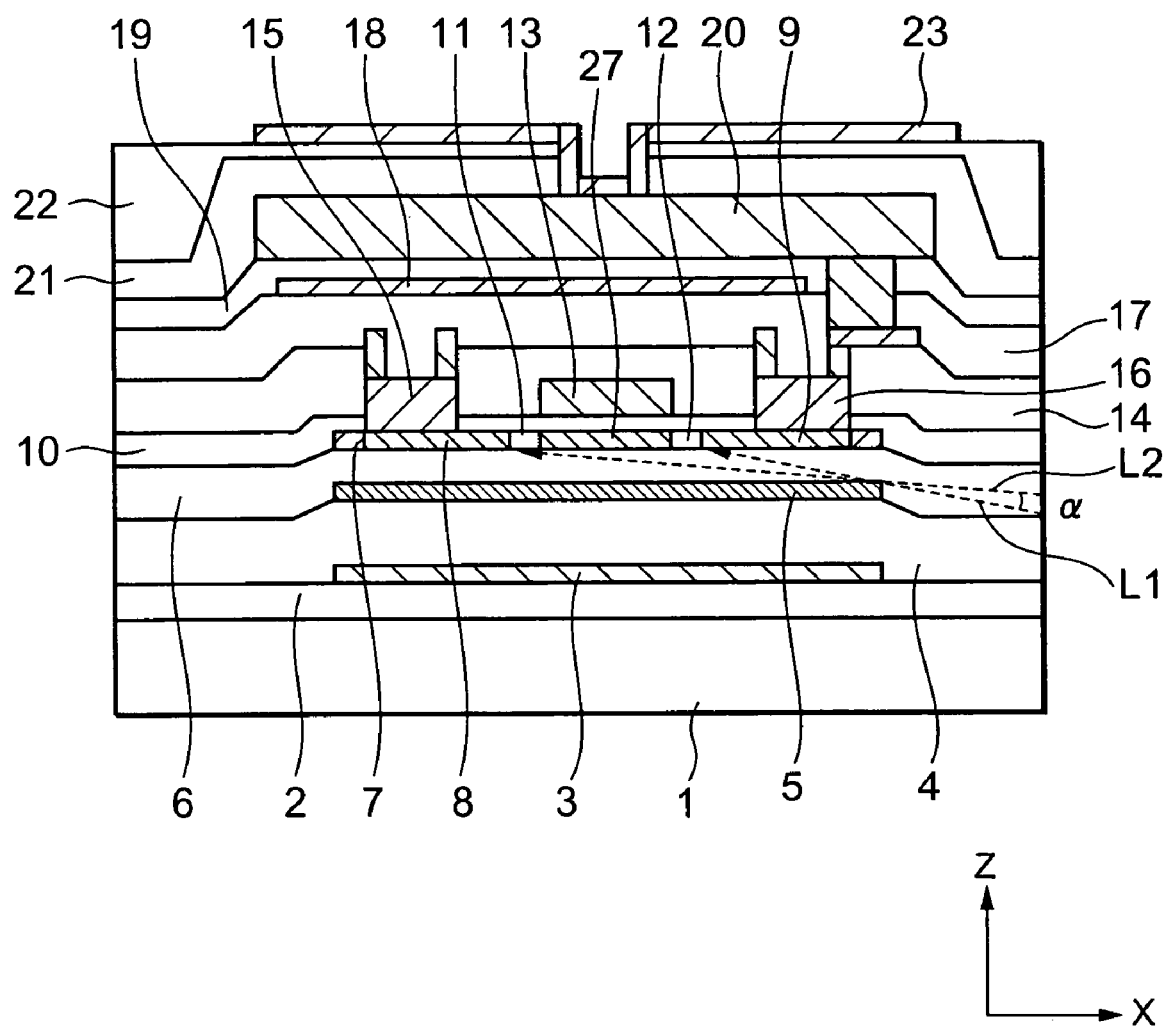
FIG. 3 is a cross-sectional view showing a cross-section taken on line A–A' of FIG. 2.
Figure 4A:
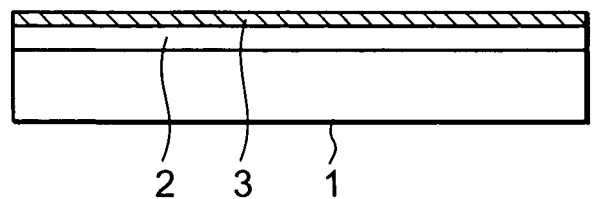
FIGS. 4(a) to 4(d) are cross-sectional views showing a method for the thin film transistor array substrate according to the first embodiment of the present invention.
Figure 4B:
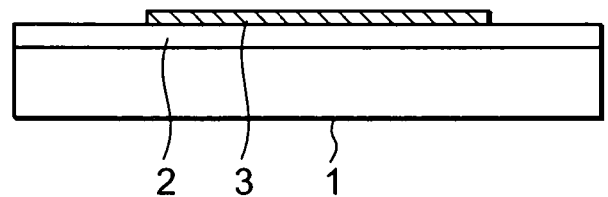
Figure 4C:
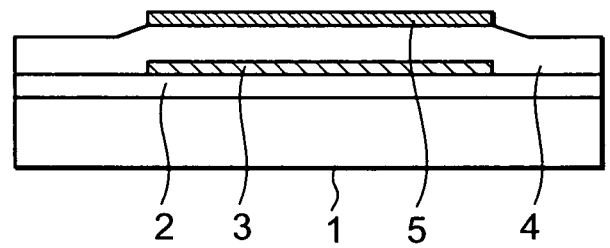
Figure 4D:
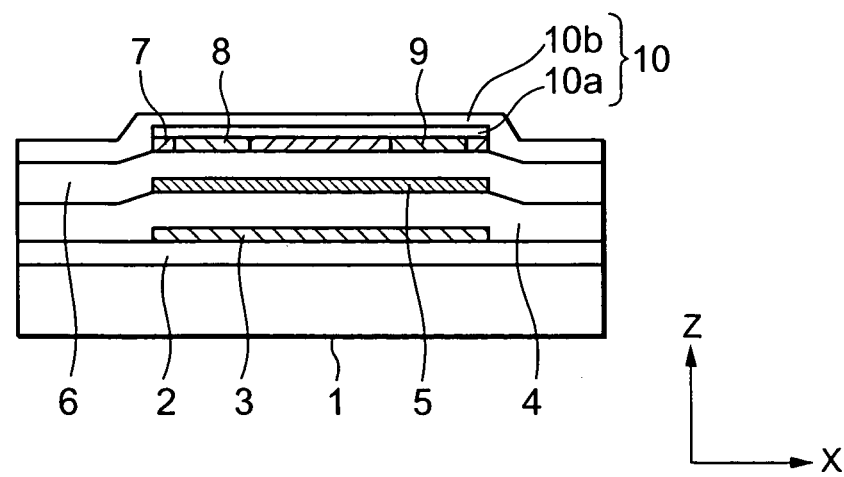

FIG. 2 is a plan view showing a thin film transistor of a liquid crystal display unit according to a first embodiment of the present invention, and FIG. 3 is a cross-sectional view taken on line A–A' of FIG. 2. In FIGS. 2 and 3, one of a plurality of thin film transistors to be contained in the TFT substrate 32 is shown.

As shown in FIG. 2, a TFT substrate 32 has a plurality of thin film transistors 33 to be arranged like a matrix shape, and each thin film transistor 33 is formed in the vicinity of intersections between a plurality of data lines 28a extending along a Y direction in parallel with each other and a plurality of gate lines 26a extending along an X direction in parallel with each other. The gate line 26a is made of, for example, polysilicon film or siliside film, in which carrier has been doped, and the data line 28a is made of aluminum film or the like. A black matrix 34 is made of chromium film or the like having light-shielding property, and is formed so as to spatially overlap the gate line 26a, the data line 28a and the thin film transistor 33. A pixel area 31 is partitioned by the gate line 26a and the data line 28a (by the black matrix 34), and there is arranged a substantially rectangular pixel electrodes 23 made of transparent electrode, such as indium tin oxide (ITO) on the pixel area 31.

As shown in FIG. 3, a TFT substrate 32 has a substrate 1, a ground dielectric film 2, a first light-shielding film 3, a first dielectric film 4, a second light-shielding film 5, a second dielectric film 6, and an active layer 7 which have been successively stacked from the lower layer side. Also, on the upper layer side of the active layer 7, there is formed a gate dielectric film 10, a gate electrode 13, a first interlayer dielectric film 14, a source electrode 15, a drain electrode 16, a second interlayer dielectric film 17, a lower electrode 18, a capacity dielectric film 19, an upper electrode 20, a third interlayer dielectric film 21, a flattened film 22 and a pixel electrode 23.

The ground dielectric film 2 is made of silicon oxide, and is formed on the entire surface on the substrate 1 made of a high strain point glass substrate. The first light-shielding film 3 is electrically conductive, and is made of tungsten siliside which reflects light to intercept light that becomes incident from the substrate 1 side. The first light-shielding film 3 is, as shown in FIG. 2, formed in a region 3a corresponding to the gate line 26a, a region 3b corresponding to the data line 28a, and a region 3c corresponding to the thin film transistor 33. The first light-shielding film 3 is, on the side of the lower layer of the region 3c corresponding to the thin film transistor 33, formed on a region to be superimposed on the active layer 7 concerning the X-direction, or on a slightly broader region than the active layer 7. The first dielectric film 4 is formed on the first light-shielding film 3 and the ground dielectric film 2.

The second light-shielding film 5 which has non-light transmission property is made of amorphous silicon, which is capable of absorbing light, and is formed in a region 5a corresponding to the gate line 26a and a region 5b corresponding to the thin film transistor 33 as shown in FIG. 2. The second light-shielding film 5 is, on the side of the lower layer of the region corresponding to the thin film transistor 33, formed on a region to be superimposed on the active layer 7 concerning the X-direction, or on a slightly broader region than the active layer 7. Also, carrier concentration of a surface portion of the second light-shielding film 5 which opposes to the active layer 7 is set to $10^{17}/cm^3$ or less. The second light-shielding film 5 is arranged so as to overlay the first light-shielding film 3 in space, so as to have approximately the same area as the first light-shielding film 3. Alternatively, the second light-shielding film may be arranged so as to have a smaller area than the first light-shielding film 3. The second dielectric film 6 is made of silicon oxide, and is formed with a film thickness of about 150 nm between the light-shielding film 5 and the active layer 7.

The active layer 7 is formed on the second dielectric film 6 to constitute the active layer of the thin film transistor 33 (FIG. 2). At both ends of the active layer 7 in the X-direction, is formed to have larger width in the Y-direction than at the central part. In the vicinity of one end of the active layer 7 in the X-direction, there is formed a source region 8, in which the carrier concentration is set high, and in the vicinity of the other end in the X-direction, there is formed a drain region 9, in which the carrier concentration is set high. The source region 8 is arranged so as to spatially overlay on the first data line 28a (FIG. 2), and is connected to the first data line 28a through the source electrode 15 (contactor 29a) made of aluminum silicon. The drain region 9 is arranged so as to spatially overlay on the second data line 28b (FIG. 2), and is connected to the second data line 28b through the drain electrode 15 (contactor 29b) made of aluminum silicon.

On the active layer 7, there is formed the gate dielectric film 10 made of silicon oxide, and on the gate dielectric film 10, there is formed a gate electrode 13 made of tungsten siliside in the vicinity of the center concerning the X-direction of the active layer 7. Between the source region 8 and a channel region 27 directly below the gate electrode, there is formed a low-concentration carrier region 11, and between the drain region 9 and the channel region 27, there is formed another low-concentration carrier region 12. The channel region 27 is arranged so as to overlay on a wiring 26b protruding from the gate line 26a in space (FIG. 2), and the gate electrode 13 and the gate line 26a are connected together through a contactor. On top of the gate dielectric film 10 and the gate electrode 13, there is formed the first interlayer dielectric film 14 made of silicon oxide.

The second interlayer dielectric film 17 is made of silicon nitride, and is formed on top of the first interlayer dielectric film 14, the source electrode 15 and the drain electrode 16. On top of the second interlayer dielectric film 17, there is formed the lower electrode 18 constituted by lamination of chromium and micro-crystalline silicon. On top of the lower electrode 18, there is formed the dielectric film 19 for the capacitance, being made of silicon nitride, and on top of the dielectric film 19, there is formed the upper electrode 20 constituted by lamination of titanium, aluminum silicon and micro-crystalline silicon. The upper electrode 20 is connected to the drain electrode 16 through the second data line 28b (FIG. 2). The upper electrode 20 and the lower electrode 18 oppose each other with the dielectric film 19 interposed therebetween to constitute pixel storage capacitance. On top of the upper electrode 20, there is formed the third interlayer dielectric film 21 made of silicon nitride.

The flattening film 22 is made of acryl, and is formed on the third interlayer dielectric film 21. The flattening film 22 enhances evenness of the surface of the thin film transistor device array substrate 32. The pixel electrode 23 is made of ITO, and is constituted as a transparent electrode to be formed on the pixel region 31 (FIG. 2). The pixel electrode 23 is formed on the flattening film 22, and is connected to the upper electrode 20 through a contact hole. In the liquid crystal display unit, an electric field to be applied to a liquid crystal (not shown) is controlled by changing an electric potential to be imparted to the pixel electrode 23 to control an amount of transmitted light from the substrate 1 side (light source side).

FIGS. 4(a) to (d), FIGS. 5(a) and (b), and FIGS. 6(a) and (b) shows a manufacturing method of the TFT substrate 32. First, by a CVD method, the ground dielectric film 2 is formed at a film thickness of about 300 nm on the entire surface on the substrate 1 made of high strain point glass substrate or the like, and on the ground dielectric film 2, the first light-shielding film 3, which is a metallic siliside film having a strong optical reflective property, is formed at a film thickness of about 175 nm by a sputtering method (FIG. 4(a)). Next, photo-resist is left behind in a region, in which the active layer 7 is formed or in a region somewhat broader than it by a photolithography, and the first light-shielding film 3 is selectively removed by a dry etching method (FIG. 4(b)).

By the CVD method, the dielectric film 4 is formed at a film thickness of about 150 nm, on top of which the second light-shielding film 5 is further formed at a film thickness of about 60 nm by the CVD method. Next, by employing an ion doping method, an ion implantation method or a vapor phase dose method, carrier is implanted into the second light-shielding film 5. In addition, as in the case of FIG. 4(b), photo-resist is left behind in a region, in which the active layer 7 is to be formed, or in a region broader than it by the photolithography, and the second light-shielding film 5 is selectively removed by the dry etching method (FIG. 4(c)). In the carrier implantation, in a carrier profile in the second light-shielding film 5 in the vertical direction, the carrier is implanted in such a manner that the carrier concentration of a surface portion to face the active layer 7 of the second light-shielding film 5 is about $10^{17}/cm^3$ or less, and that during implantation, the peak carrier concentration becomes closer to a surface among the active layer 7 which opposes the dielectric film 6.

By the CVD method, the dielectric film 6 is formed at a film thickness of about 150 nm, the active layer 7 at a film thickness of abut 60 nm is formed, and further the gate dielectric film 10a is formed at a film thickness of about 10 nm by the CVD method. Thereafter, the carrier is implanted into the active layer 7 in such a manner that the carrier concentration becomes about $10^{15}/cm^3$ by employing the ion doping method or the ion implantation method. Then, in order to improve quality of the crystal of the active layer 7, the active layer 7 is annealed by excimer laser. Thereby, quality of the crystal of the active layer 7 is improved, and is formed a thin film transistor with excellent characteristics.

Then, photo-resist is left behind in a region in which the active layer 7 is formed by photolithography, and any other region than the region, in which the active layer 7 is formed, is removed by the dry etching method. Thereafter, photo-resist is left behind in any other region than a region, in which the source region 8 and the drain region 9 should be formed, by photolithography, and by employing the ion doping method, or the ion implantation method, the carrier is implanted in such a manner that the carrier concentration becomes about $5 \times 10^{20}/cm^3$ respectively to form the source region 8 and the drain region 9. After the carrier implantation, a gate dielectric film 10b is formed at a film thickness of about 90 nm by the CVD method (FIG. 4(d)).

Figure 5A:
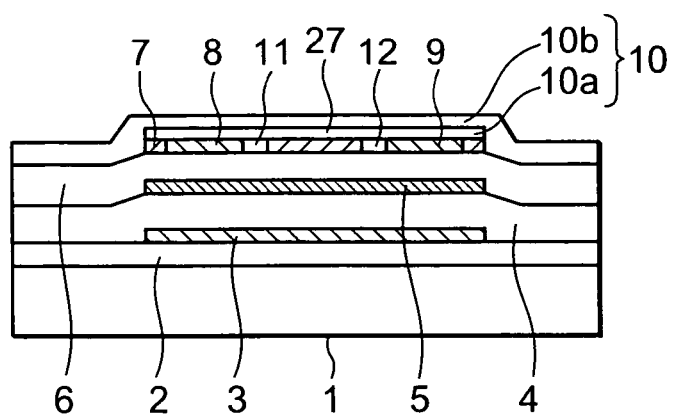
FIGS. 5(a) and 5(b) are cross-sectional views showing a method for the thin film transistor array substrate subsequent to FIG. 4(d).

In any region other than a region between the source region 8 and a region 27 corresponding to the gate electrode 13, and a region between the drain region 9 and a region 27 corresponding to the gate electrode 13, photo-resist is left behind by the photolithography, and by employing the ion doping method, or the ion implantation method, carrier with low concentration is implanted in such a manner that the carrier concentration becomes about $10^{17}/cm^3$ to form low-concentration carrier regions 11, 12 (FIG. 5(a)). Thereafter, the carrier implanted is activated by a CVD equipment to hydrogenate.

Figure 5B:
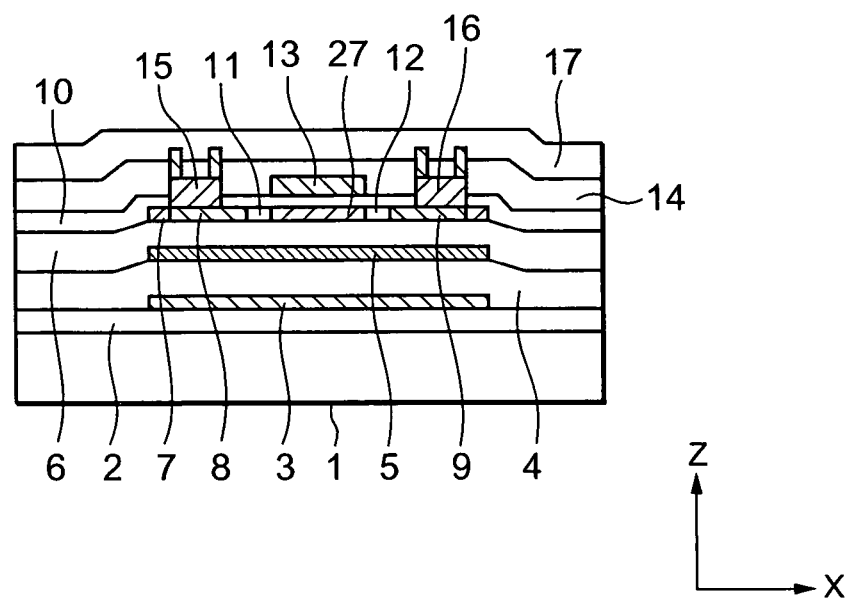

Subsequently, as in the case of a method of a thin film transistor device array substrate constituting a normal liquid crystal display unit, there is formed the gate electrode 13, the first interlayer dielectric film 14, the source electrode 15 and the drain electrode 16. When forming the source electrode 15 and the drain electrode 16, in the liquid crystal display unit, to any peripheral circuit (not shown) other than the pixel region of the thin film transistor device array substrate 32, the first light-shielding film 3 and the second light-shielding film 5 will be electrically connected respectively. Thereafter, a second interlayer dielectric film 17 is formed (FIG. 5(b)).

By the CVD method, a crystalline silicon film is formed at a film thickness of about 100 nm, and chromium is formed at a film thickness of about 140 nm by the sputtering method to form a lower electrode 18 to be constituted by their lamination. By the photolithography, photo-resist is left behind in a region, in which the lower electrode 18 is formed, to form the lower electrode 18 by the dry etching method. Next, the dielectric film 19 is formed at a film thickness of about 100 nm by the CVD method to form a contact hole through which the upper electrode 20 is connected to the drain electrode 16. Thereafter, the upper electrode 20 that is for the storage capacitance constituted by lamination of titanium, aluminum silicon and crystalline silicon is formed at a film thickness of about 550 nm, and photo-resist is left behind in a region, in which the upper electrode 20 is formed, by the photolithography to form the upper electrode 20 by the dry etching method (FIG. 6(a)).

By the CVD method, the third interlayer dielectric film 21 is formed at a film thickness of about 400 nm, and subsequently the flattening film 22 is formed at a film thickness of about 1690 nm by spin coating. After the flattening film 22 is formed with a contact hole for connecting the pixel electrode 23 to the upper electrode 20 of the storage capacitance, the pixel electrode 23 is formed at a film thickness of about 40 nm by the sputtering method (FIG. 6(b)). By the above-described fabrication processes, the TFT substrate 32 having the cross-sectional structure shown in FIG. 3 is obtained.

In the present embodiment, between the substrate 1 of the TFT substrate 32 and the active layer 7, there are arranged the first light-shielding film 3 made of metallic siliside having a high electrical conductivity, and the second light-shielding film 5 having non-light transmission property. A distance between the second light-shielding film 5 and the active layer 7 (the film thickness of the dielectric film 6) may be set to about 150 nm. Accordingly, as compared with a conventional liquid crystal display unit shown in FIG. 1, in which the distance between the light-shielding film and the active layer is set to 380 nm, it is possible to improve the light-shielding effect by reducing the amount of light that is incident on the active layer 7, and to further effectively intercept light(return light) that returns from the substrate 1 side to the thin film transistor 33 (FIG. 3).

The thin film transistor 33 to be formed in the TFT substrate 32 has a high light-shielding effect for the active layer 7, and is less affected by light-induced leakage current, and therefore, a switching characteristic of the thin film transistor 33 is improved, and it becomes satisfactory to control the pixel electrode 23. Thereby, in the liquid crystal display unit including the TFT substrate 32, even when used as a light valve in a projection type display, in which light with high luminance is used as a light source, high luminance and high contrast can be realized.

Figure 1:
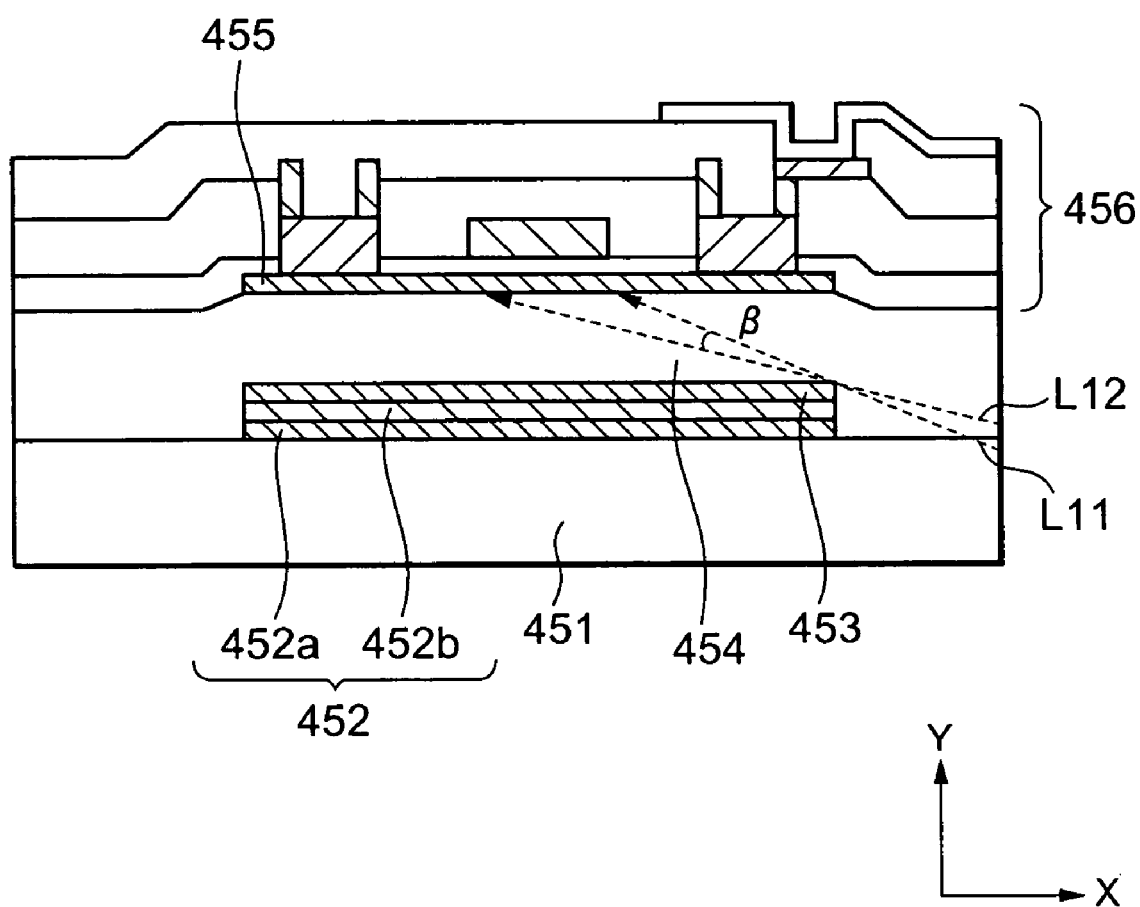
FIG. 1 is a cross-sectional view showing a cross-sectional structure of the thin film transistor array substrate in a conventional liquid crystal display unit.

As shown in FIG. 3, in the present embodiment, since the distance between the active layer 7 and the second light-shielding film 5 is set shorter than in the conventional case, the angular difference α becomes smaller than an angular difference β between a critical ray of light L11 and a critical ray of light L12 shown in FIG. 1. For this reason, as compared with the conventional liquid crystal display unit, the amount of light that becomes incident on the channel region 27 of the active layer 7 and the low-concentration carrier regions 11, 12 can be reduced, and performance deterioration such as lowered contrast due to the light-induced leakage current is prevented, making it possible to improve the performance of the liquid crystal display unit.

On the other hand, in the conventional case when the distance between the second light-shielding film 453 and the active layer 455 is set to be short, electric potential to be applied on the first light-shielding film 452 and the second light-shielding film 453 causes the second light-shielding film 453 to exert on the thin film transistor as a back gate, and brings about leakage current due to the back gate of the thin film transistor 33. It is because the second light-shielding film 453 is electrically conductive, when the second light-shielding film 453 is brought close to the active layer 455, the active layer 455 is electrically affected. (FIG. 1).

In the present embodiment, the carrier concentration in a surface portion which opposes to the active layer 7 of the second light-shielding film 5 is made lower, whereby an electric field due to electric potential to be applied to the first light-shielding film 3 is relaxed by the light-shielding film 5 to reduce electrical influence to the thin film transistor 33. For this reason, even when the second light-shielding film 5 and the active layer 7 come close to each other, the performance of the liquid crystal display unit is not deteriorated under the influence of the leakage current due to the back gate.

Figure 7A:
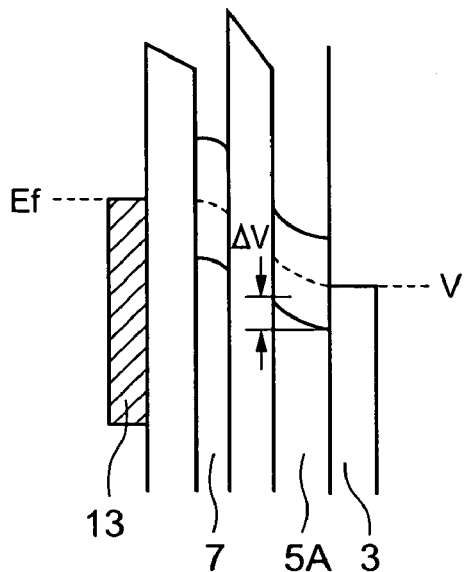
FIGS. 7(a) and 7(b) are energy band views showing the vicinity of the active layer from the light-shielding film respectively.
Figure 8:
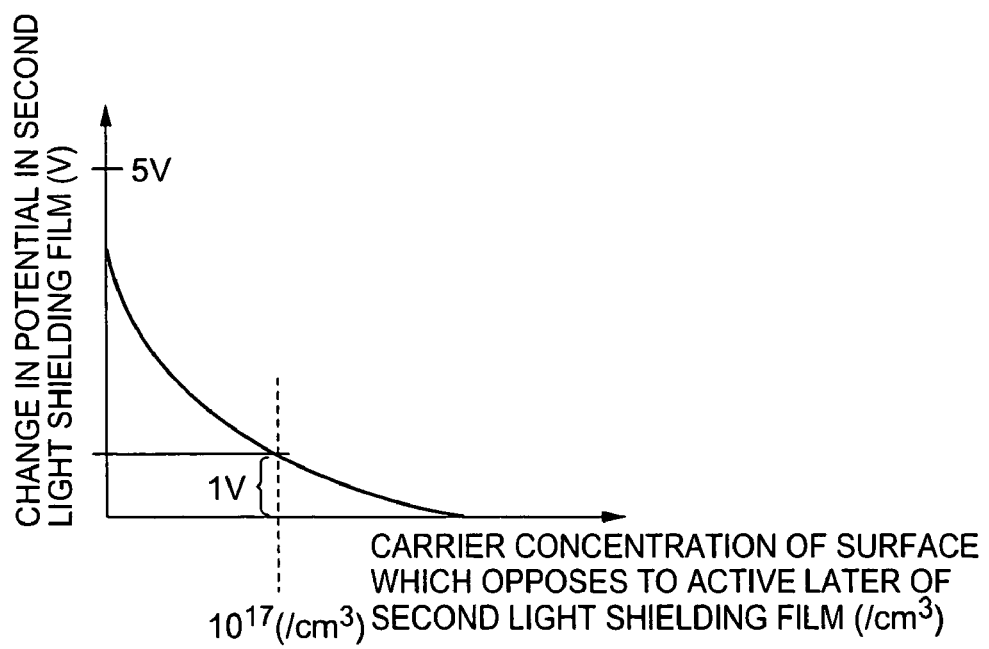
FIG. 8 is a graph showing relationship between a carrier concentration of the light-shielding film and an amount of change in potential in the light-shielding film.

FIGS. 7(a) and (b) show an energy band diagram in the vicinity of the active layer from the light-shielding film, in this embodiment and in the conventional structure, respectively, and FIG. 8 shows a relationship between carrier concentration of the light-shielding film and an amount of change in electric potential of the light-shielding film. FIGS.

Figure 7B:
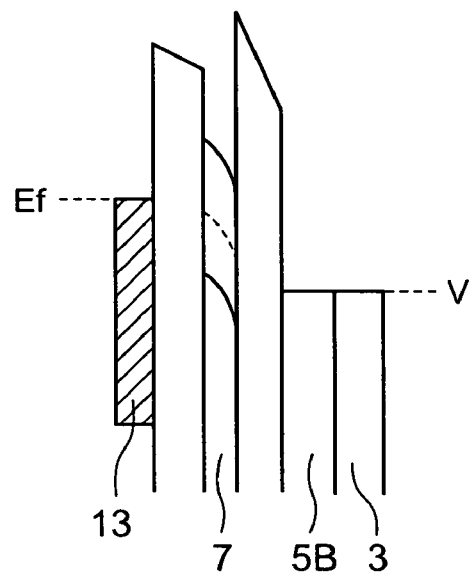

7(*a*) and (*b*) show aspects of energy level between the first light-shielding film 3 and the gate electrode 13 shown in FIG. 3, in this embodiment and in the conventional structure, respectively, and in FIG. 7(*a*), the carrier concentration of the second light-shielding film 5A has been set to be, for example, as low as $10^{17}/cm^3$. In FIG. 7(*b*), the carrier concentration of the second light-shielding film 5B has been set to be, for example, as high as $10^{22}/cm^3$.

When the carrier concentration of the second light-shielding film 5A is low as shown in FIG. 7(*a*), electric potential V to be applied to the first light-shielding film 3 causes a bend in the band in the second light-shielding film 5A to generate potential difference (loss of electric potential) $\Delta V$ between the potential of the second light-shielding film 5A on the first light-shielding film 3 side and the active layer 7 side potential. On the other hand, when the carrier concentration of the second light-shielding film 5B is high as shown in FIG. 7(*b*), no bend in the band occurs in the second light-shielding film 5B, but the potential of the second light-shielding film 5B becomes equal to the potential V of the first light-shielding film 3, and no potential difference is generated between the potential of the second light-shielding film 5B on the first light-shielding film 3 side and the active layer 7 side potential. For this reason, if the potential difference between the first light-shielding film 3 and the gate electrode 13 is constant, the bend in the band in the active layer 7 becomes larger in the case of FIG. 7(*b*) than in the case of FIG. 7(*a*).

Comparing FIG. 7(*a*) with FIG. 7(*b*), in FIG. 7(*a*) the second light-shielding film 5A helps to relax the electric field of the first light-shielding film 3, while in FIG. 7(*b*), the second light-shielding film 5B does not help to relax the electric field of the first light-shielding film 3. The bend in the band in the active layer 7, in which the carrier concentration of the second light-shielding film 5 is lower in FIG. 7(*a*), can become smaller by an amount corresponding to the potential difference $\Delta V$ in the second light-shielding film 5A, compared with the bend in the band in the active layer 7 in FIG. 7(*b*).

A relationship between the carrier concentration of the second light-shielding film 5 and potential difference $\Delta V$ occurring in the second light-shielding film is shown in FIG. 8. As shown in FIG. 8, the lower the carrier concentration becomes of the surface portion which opposes the active layer 7 of the second light-shielding film 5, the greater the potential difference becomes in the second light-shielding film 5. When a potential of, for example, 5 V is applied to the first light-shielding film 3, if the carrier concentration of the surface portion which opposes to the active layer 7 of the second light-shielding film 5 is set to be $10^{17}/cm^3$ as shown in the same figures, the potential difference $\Delta V$ becomes 1 V, and the electric field of the first light-shielding film 3 can be relaxed by 20%. Therefore, by setting the carrier concentration of the surface portion which opposes the active layer 7 of the second light-shielding film 5 to $10^{17}/cm^3$ or less, it is possible to relax the electric potential due to the first light-shielding film 3 by 20% or more, and an effect of relaxing the electric field due to the electric potential of the first light-shielding film 3 is great.

In an illustrative embodiment of the present invention, since electric field intensity of the surface portion of the second light-shielding film which opposes the active layer of the thin film transistor is set to be equal to or less than 80% of that of the surface portion opposite to the first light-shielding film, an electric field due to the first light-shielding film which affects the active layer of the thin film transistor, can be relaxed by the second light-shielding film. For this reason, even when the second light-shielding film is brought close to the active layer of the thin film transistor, it is possible to keep the leakage current due to the back gate effect low, and the switching characteristic of the thin film transistor becomes excellent.

In the present embodiment, the film thickness of the second dielectric film 6 has been set to about 150 nm and the carrier concentration of the surface portion which opposes the active layer 7 of the second light-shielding film 5 has been set to about $10^{17}/cm^3$, but when the film thickness of the second dielectric film 6 is made thinner than 150 nm and distance between the second light-shielding film 5 and the active layer 7 is further made shorter, the carrier concentration of the surface portion which opposes the active layer 7 of the second light-shielding film 5 can be set lower than $10^{17}/cm^3$. In this case, the carrier concentration of the surface portion which opposes the active layer 7 of the second light-shielding film 5 is set lower, whereby the potential difference $\Delta V$ occurring in the second light-shielding film 5 becomes larger so that a relaxation operation of the second light-shielding film 5 becomes greater. For this reason, even when the film thickness of the second dielectric film 6 has been made thinner in order to enhance the light shielding effect due to the second light-shielding film 5, it is possible to keep the leakage current due to the back gate effect. The carrier concentration of the surface portion which opposes to the active layer 7 of the second light-shielding film 5 may be set in such a manner that the potential difference between the potential of the second light-shielding film 5 on the first light-shielding film 3 side and the active layer 7 side potential exceeds 20% of the potential to be applied to the first light-shielding film 3.

When setting the film thickness of the second dielectric film 6 (distance between the second light-shielding film 5 and the active layer 7) to 350 nm or more, light reaching the active layer 7 is increased and light-induced leakage current becomes conspicuous. Also, when setting the film thickness of the second dielectric film 6 to 100 nm or less, the second light-shielding film 5 electrically affects the active layer 7, and leakage current due to the back gate becomes conspicuous. Therefore, the film thickness of the second dielectric film 6 may be set to from about 100 nm to about 350 nm. The film thickness of the second dielectric film 6 is set to from about 100 nm to about 350 nm, whereby it is possible to enhance the light shielding effect, to prevent the light-induced leakage current and the leakage current due to the back gate. The film thickness of the second dielectric film 6 may be within from 150 nm to 250 nm in terms of the light shielding effect. When the film thickness of the second light-shielding film 5 is set to 50 nm or less, the second light-shielding film 5 has no non-light transmission property, and when it is set to 200 nm or more, the second light-shielding film 5 electrically affects the active layer 7, and the leakage current due to the back gate becomes conspicuous. It is possible to enhance the light shielding effect, to prevent the light leakage current and the leakage current due to the back gate effect.

Figure 9:
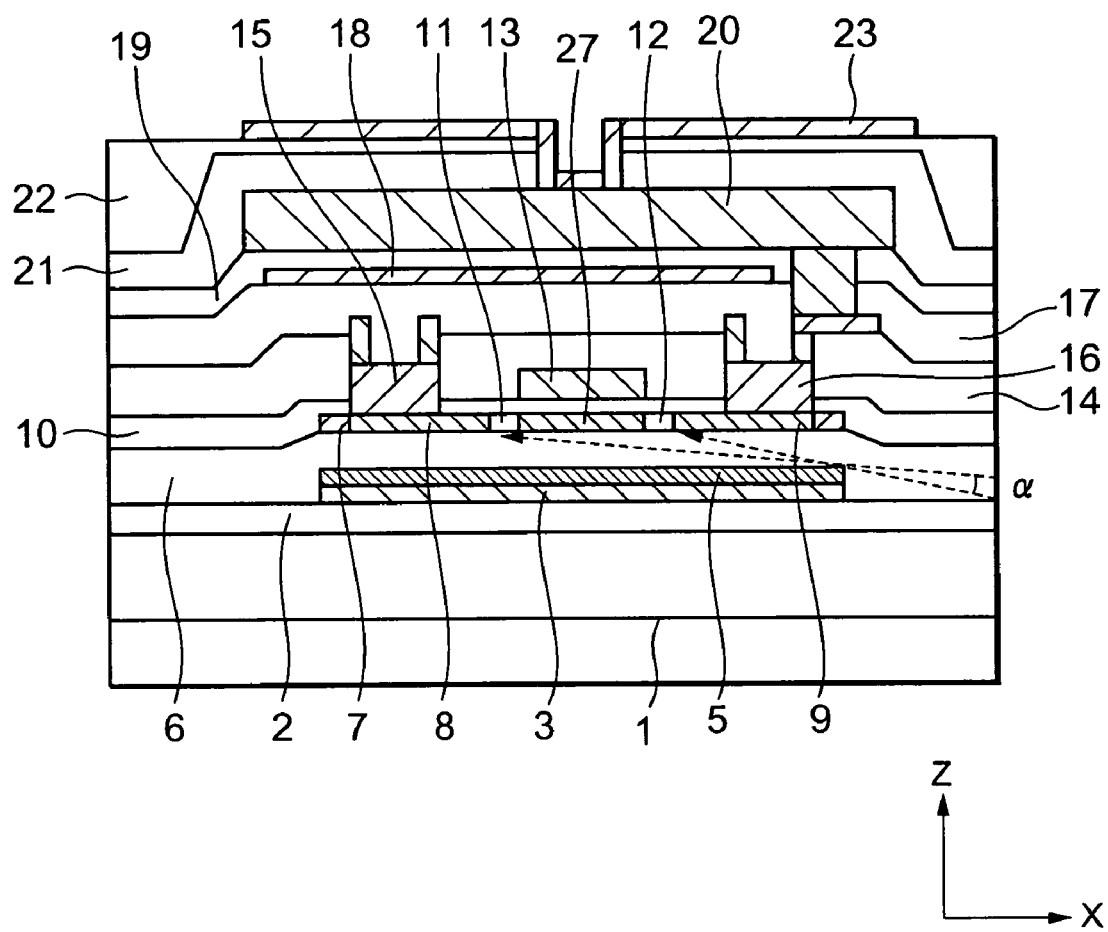
FIG. 9 is a cross-sectional view showing a cross-sectional structure of the thin film transistor array substrate according to a second embodiment of the present invention.

FIG. 9 shows cross-sectional structure of a TFT substrate 32A according to a liquid crystal display unit of a second embodiment of the present invention. The TFT substrate 32A of the present embodiment has a planar structure similar to the plan view shown in FIG. 2, and the cross-section shown in FIG. 9 corresponds to the cross-section taken on line A–A' of FIG. 2. The present embodiment is different from the first embodiment in that the first light-shielding film 3 and the second light-shielding film 5 have been stacked on each other without the dielectric film 4(FIG. 3).

The TFT substrate 32A has a substrate 1, a ground dielectric film 2, a fist light-shielding film 3, a second light-shielding film 5, a second dielectric film 6 and an active layer 7 which have been stacked in this order from the lower layer side.

Figure 10A:
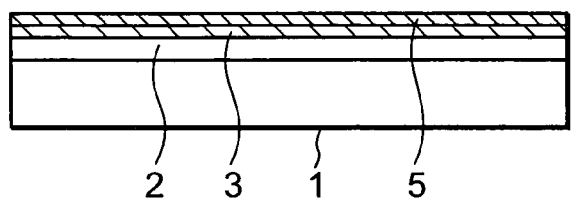
FIGS. 10(a) and 10(b) are cross-sectional views showing a method for the thin film transistor array substrate according to the second embodiment of the present invention.

FIGS. 10(a) and (b) show a method of making the TFT substrate 32A of the second embodiment of the present invention. First, by the CVD method, a ground dielectric film 2 is formed at a film thickness of about 300 nm on the entire surface on the substrate 1 made of, for example, high strain point glass substrate or the like. On the ground dielectric film 2, a tungsten silicide film, which is a metallic silicide film having a optical reflective property, is formed at a film thickness of about 175 nm as the first light-shielding film 3 by the sputtering method. Further, on the upper layer thereof, a second light-shielding film 5 is stacked at film thickness of about 60 nm by the CVD method (FIG. 10(a)).

Figure 10B:
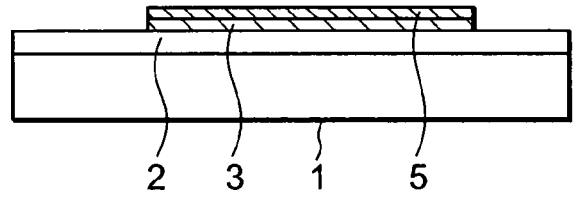

Next, photo-resist is left behind in a region, in which the active layer 7 is formed, or in a region somewhat broader than it by the photolithography, and the second light-shielding film 5 is removed by the dry etching method (FIG. 10(b)). Subsequently to FIG. 10(b), by fabricating by the similar process to FIGS. 4(d) to 6(b), there can be obtained a TFT substrate 32A according to the present embodiment having the cross-sectional structure shown in FIG. 9.

In the present embodiment, since the first light-shielding film 3 and the second light-shielding film 5 are stacked without forming the first dielectric film 4, a process of forming the first dielectric film 4 can be omitted. Even in this case, similar to the first embodiment, the light shielding effect for the active layer 7 is high, and even in the liquid crystal display unit including the TFT substrate 32A of the present embodiment, high luminance and high contrast can be realized. Also, since the first light-shielding film 3 and the second light-shielding film 5 are directly stacked, electric potential of the first light-shielding film 3 and that of the second light-shielding film 5 become equal to each other, and unlike the first embodiment, it is not necessary to implant carrier into the second light-shielding film 5, but to a peripheral circuit (not shown), only the first light-shielding film 3 can be electrically connected. For this reason, the fabrication process becomes simpler than the first embodiment, and therefore, it becomes possible to shorten the term of fabrication, and the throughput of the liquid crystal display unit fabrication can be improved.

Figure 11:
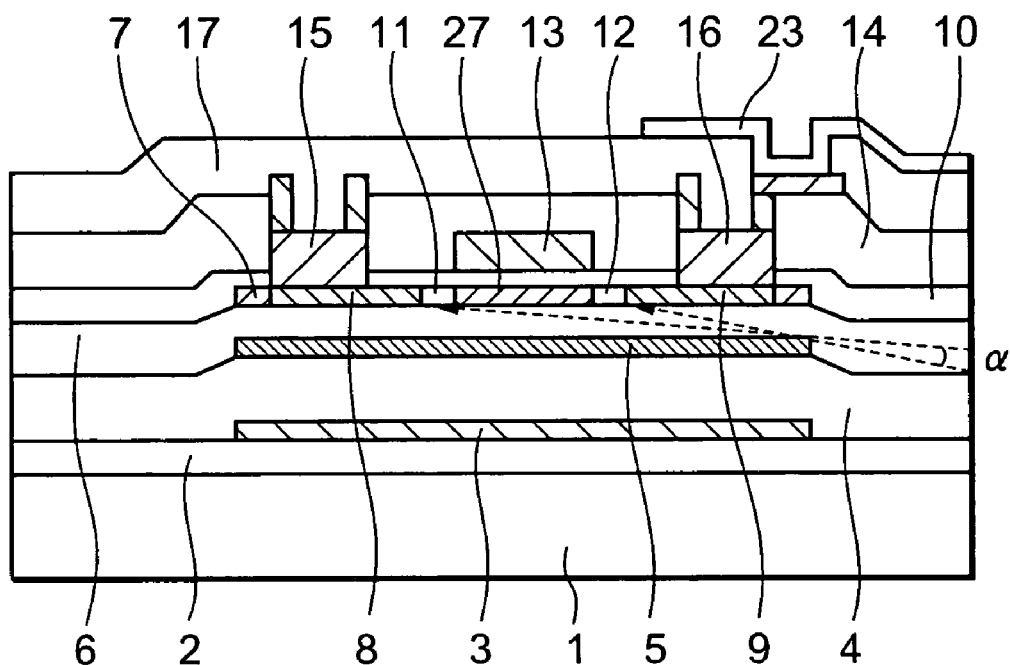
FIG. 11 is a cross-sectional view showing a cross-sectional structure of the thin film transistor array substrate according to a third embodiment of the present invention.

FIG. 11 shows a cross-sectional structure of a TFT substrate 32B of a liquid crystal display unit according to a third embodiment of the present invention. The TFT substrate 32B of the present embodiment has planar structure similar to the plan view shown in FIG. 2, and the cross-section shown in FIG. 11 corresponds to the cross-section taken on line A–A' of FIG. 2. The present embodiment is different from the first embodiment in that there is provided no storage capacitance as shown in FIG. 3.

The TFT substrate 32B is, on the side of the upper layer of the active layer 7, formed with a gate dielectric film 10, a gate electrode 13, a first interlayer dielectric film 14, a source electrode 15, a drain electrode 16, a second interlayer dielectric film 17, and a pixel electrode 23. This TFT substrate 32B is obtained as below: as in the case of FIGS. 4(a) to 5(b), up to the second interlayer film 17 is formed; thereafter, without producing the storage capacitance, the second interlayer dielectric film 17 is formed with a contact hole; and the pixel electrode 23 is connected to the drain electrode 16 to thereby obtain the TFT substrate 32B.

In the present embodiment, unlike the first embodiment, the TFT substrate 32B has no storage capacitance. Even in this case, as in the case of the first embodiment, the light shielding effect for the active layer 7 due to the first light-shielding film 3 and the second light-shielding film 5 is increased, and even in the liquid crystal display unit including the TFT substrate 32B according to the present embodiment, high luminance and high contrast can be realized.

Figure 12:
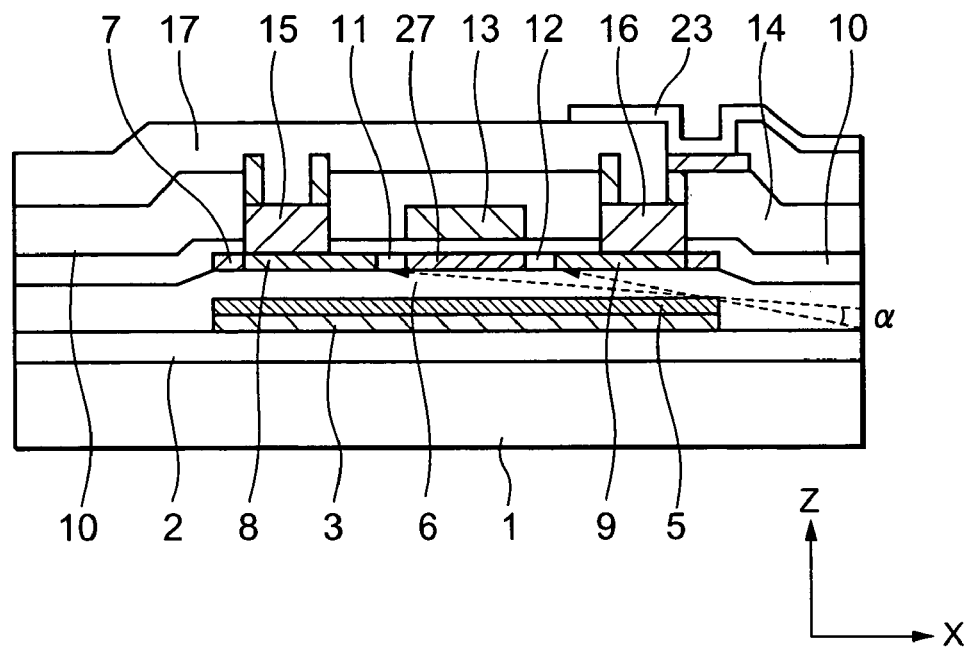
FIG. 12 is a cross-sectional view showing a cross-sectional structure of the thin film transistor array substrate according to a fourth embodiment of the present invention.

FIG. 12 shows cross-sectional structure of a TFT substrate 32C of a liquid crystal display unit according to a fourth embodiment of the present invention. The TFT substrate 32C of the present embodiment has planar structure similar to the plan view shown in FIG. 2, and the cross-section shown in FIG. 12 corresponds to the cross-section taken on line A–A' of FIG. 2. The present embodiment is different from the second embodiment in that there is provided no storage capacitance shown in FIG. 9.

The TFT substrate 32C is, on the side of the upper layer of the active layer 7, formed with a gate dielectric film 10, a gate electrode 13, a first interlayer dielectric film 14, a source electrode 15, a drain electrode 16, a second interlayer dielectric film 17, and a pixel electrode 23. This TFT substrate 32C is obtained as below: as in the case of FIGS. 10(a) and (b) and FIGS. 4(d) to 5(b), up to the second interlayer film 17 is formed; thereafter, without producing the storage capacitance, the second interlayer dielectric film 17 is formed with a contact hole; and the pixel electrode 23 is connected to the drain electrode 16 to thereby obtain the TFT substrate 32C.

In the present embodiment, unlike the second embodiment, the TFT substrate 32C has no storage capacitance. Even in this case, as in the case of the first embodiment, the light shielding effect for the active layer 7 due to the first light-shielding film 3 and the second light-shielding film 5 is high, and even in the liquid crystal display unit including the TFT substrate 32C according to the present embodiment, high luminance and high contrast can be realized. Also, as in the case of the second embodiment, the throughput of the liquid crystal display unit fabrication can be improved.

Figure 13:
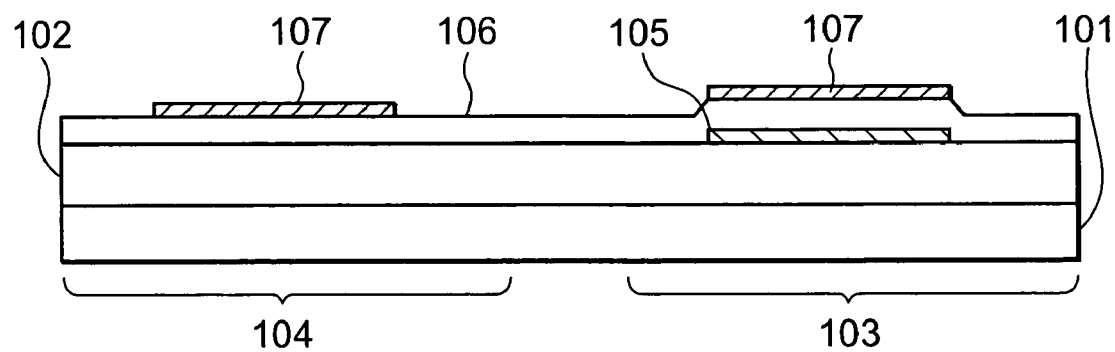
FIG. 13 is a cross-sectional view showing a cross-sectional structure of the thin film transistor array substrate according to a fifth embodiment of the present invention.

FIG. 13 shows cross-sectional structure of a TFT substrate 32D of a liquid crystal display unit according to a fifth embodiment of the present invention. In this respect, FIG. 13 shows a process of forming the active layer 107 corresponding to an active layer 7 in FIG. 3. Also, the TFT substrate 32D is close to the pixel region 31 shown in FIG. 2, and the drain has a pixel matrix region 103, in which there is formed a thin film transistor for controlling a pixel to be connected to the pixel electrode, and a driving region 104, in which a peripheral circuit such as a driving circuit is formed.

The TFT substrate 32D having cross-sectional structure shown in FIG. 13 is obtained as below. First, as in the case of FIGS. 4(a) and (b), a ground dielectric film 102 is formed on the entire surface on a substrate 101 to form a light-shielding film 105 at a desired place. At this time; a light-shielding film 105 is formed in a pixel matrix region 103 but the light-shielding film 105 is not formed in a driving region 104. The light-shielding film 105 may have no light transmission property, but can have electrical conductivity and heat conductivity.

Next, a dielectric film 106 is formed at a thickness of 150 nm, and on the dielectric film 106, an active layer 107 is formed. The active layer 107 is formed as an amorphous silicon film, and is formed in both the pixel matrix region 103 and the driven region 104. The thin film transistor in the pixel matrix region 103 is to be employed as a transistor for controlling the pixel electrode, and the thin film transistor in the driven region 104 is to be employed as a transistor for constituting a driven circuit or the like. Active layers 107 to be formed in both the pixel matrix region 103 and the driven region 104 are annealed by excimer laser.

In a process of forming the active layer 107, since on the side of the lower layer of the active layer 107 in the pixel matrix region 103, there is formed a light-shielding film 105, when the active layer which is an amorphous silicon film is irradiated with laser light in laser annealing, heat to be generated by the laser light is transmitted to the substrate 101 side through the heat conduction property of the light-shielding film 105. Thereby, the active layer 107 is formed as a polysilicon film with low crystalline quality, i.e. a low mobility. For this reason, in the thin film transistor to be formed in the pixel matrix region 103, light-induced leakage current is further reduced. On the other hand, the active layer 107 in the driven region 104 is laser annealed as in the case of the active layer to be formed in the pixel matrix region 103, but since on the side of the lower layer of the active layer 107 in the driven region 104, there is formed no light-shielding film 105, not as much heat to be generated by the laser light is transmitted on the substrate 101 side. Thereby, the active layer 107 is formed as a polysilicon film having a high crystalline quality, i.e. a high mobility. For this reason, switching characteristic of the thin film transistor to be formed in the driven region 104 will be improved.

In the present embodiment, on the side of the lower layer of the active layer 107 for constituting a thin film transistor within the pixel matrix region 103, there is arranged a light-shielding film 105 having a heat conductivity, but on the side of the lower layer of the active layer 107 for constituting a thin film transistor within the driven region 104, there is arranged no light-shielding film. In this case, when the active layers 107 in both regions are laser annealed, depending upon whether or not there is formed the light-shielding film 105 having heat conduction property on the lower layer side even if the active layer 107 is formed in the same process, a characteristic of the thin film transistor to be formed within the pixel matrix region 103 becomes different from a characteristic of the thin film transistor to be formed in the driven region 104.

Since the above-described difference in the characteristics of the thin film transistor is due to the heat conduction property of the light-shielding film 105, the above-described difference in characteristic of thin film transistor can be obtained if a film with a high heat conductivety as a light-shielding film exists on the side of the lower layer of the active layer 107 to be formed in the pixel matrix region 103 irrespective of the structure of the light-shielding film. When the film thickness (distance between the light-shielding film 105 and the active layer 107) of the dielectric film 106 is set to 350 nm or more, heat in the heat treatment during the laser annealing does not transmit to the light-shielding film 105 with a heat conductivety sufficiently. The characteristic of the active layer 107 does not change depending upon whether or not there is formed the light-shielding film 105 on the lower layer side. Also, when the film thickness of the dielectric film 106 is set to 100 nm or less, between the active layer 107, in which on the lower layer side, there has been formed the light-shielding film 105 and the active layer 107, in which on the lower layer side, there has been formed no light-shielding film 105, a change in the characteristic due to the heat treatment in the laser annealing is too great. Further, an excellent ON-characteristic of the thin film transistor cannot be obtained. Therefore, the film thickness of the dielectric film 106 may be set to between about 100 nm and about 350 nm as in the case of the second dielectric film 6 (FIG. 3) in the first embodiment.

FIG. 14 shows cross-sectional structure of a liquid crystal display according to a sixth embodiment of the present invention. The thin film transistor substrate 32 according to the first embodiment, an opposite substrate 41, and a liquid crystal layer 40 are disposed as shown in FIG. 14. The thin film transistor substrate may be used any thin film transistor substrates according to first to fifth embodiments.

In the above-described first to fourth embodiments, there has been shown an example in which a tungsten siliside film is used as the first light-shielding film 3, but in place of the tungsten, tantalum (Ta), titanium (Ti), chrome (Cr), molybdenum (Mo) and the like can be appropriately used, and these metals don't necessarily have high melting temperatures. Also, as the light-shielding film 105 in the fifth embodiment, as in the case of the first to fourth embodiments, a tungsten siliside film can be also used, and in place of the tungsten, tantalum (Ta), titanium (Ti), chromium (Cr), molybdenum (Mo) and the like can be appropriately used.

In the above-described first to fourth embodiments, there has been shown an example, in which as the second light-shielding film 5, amorphous silicon having photoabsorption property may be used, but even when in place thereof, there has been used a semiconductor thin film such as mycrocrystalline silicon (μc-Si), amorphous Si-x Gex system, polygermanium (Poly-Ge), amorphous germanium (a-Ge) and poly Si-xGex system, the similar effect to each of the above-described embodiments can be obtained. Also, in the above-described first to fourth embodiments, there has been shown an example, in which as the gate electrode 13, a tungsten siliside film is used, but in place thereof, tantalum (Ta), titanium (Ti), chromium (Cr), molybdenum (Mo), aluminum (Al) and the like may be appropriately used.

In the above-described first to fourth embodiments, the description has been made of an example, in which the CVD method is used to form the second light-shielding film 5 and the like, but in place thereof, the sputtering method, the plasma CVD method or the like can be also used. Also, film thickness of the dielectric film formed on the entire surface on the substrate, the light-shielding film, the active layer of the thin film transistor, the gate dielectric film and the like shows one example, and can be appropriately changed in accordance with the object, use and the like. Also, in carrier implantation on the second light-shielding film 5, it may be possible to obtain the second light-shielding film with low carrier concentration by implanting, on a semiconductor film having one conductive type carrier, a carrier of a conductive type reverse to the carrier.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments without the use of inventive faculty. Therefore, the present invention is not intended to be limited to the embodiments described herein but is to be accorded the widest scope as defined by the limitations of the claims and equivalents.

What is claimed is:

1. A thin film transistor comprising:
an active layer, in which a source region and drain region are formed;
a first light-shielding film shielding a light incident on said active layer; and
a second light-shielding film disposed between said active layer and said first light-shielding film,
wherein a carrier concentration of at least a surface portion of said second light-shielding film which opposes said active layer is about $10^{17}/cm^3$ or less.

2. The thin film transistor according to claim 1,
wherein a distance between said second light-shielding film and said active layer is from about 100 nm to about 350 nm.

3. The thin film transistor according to claim 1,
wherein said active layer has a low-concentration carrier region between a source region and a channel region, and
wherein between a drain region and the channel region, said low-concentration carrier region has the same conductive type as the source region and the drain region and has lower impurity concentration than the source region and the drain region, and
wherein said second light-shielding film has a portion which overlaps said channel region and said low-concentration carrier region in terms of plane.

4. The thin film transistor according to claim 1,
wherein said second light-shielding film has a photo-absorption property.

5. The thin film transistor according to claim 1, further comprising a dielectric film disposed between said first light-shielding film and said second light-shielding film.

6. The thin film transistor according to claim 1, wherein said second light-shielding film is formed on said first light-shielding film.

7. A thin film transistor comprising:
an active layer, in which a source region and drain region are formed;
a first light-shielding film shielding a light incident on said active layer; and
a second light-shielding film disposed between said active layer and said first light-shielding film,
wherein an electric field intensity of a surface portion of said second light-shielding film which opposes said active layer includes about 80% or less of that of a surface portion of said second light-shielding film which opposes said first light-shielding film.

8. The thin film transistor according to claim 7,
wherein a distance between said second light-shielding film and said active layer is from about 100 nm to about 350 nm.

9. A thin film transistor comprising:
an active layer, in which a source region and drain region are formed;
a first light-shielding film shielding a light incident on said active layer; and
a second light-shielding film disposed between said active layer and said first light-shielding film,
wherein said second light-shielding film is made of a semi-insulating film, and wherein a carrier concentration of said second light-shielding film is about $10^{17}/cm^3$ or less.

10. A thin film transistor comprising:
an active layer, in which a source region and drain region are formed;
a first light-shielding film shielding a light incident on said active layer;
a second light-shielding film disposed between said active layer and said first light-shielding film,
wherein said second light-shielding film is made of a material selected from a group consisting of amorphous silicon, crystallite silicon, amorphous Silicon Germanium, poly germanium, amorphous germanium, poly Silicon Germanium, and any combination thereof, and wherein a carrier concentration of said second light-shielding film is about $10^{17}/cm^3$ or less.

11. A thin film transistor substrate comprising:
a light transmission substrate;
a transistor array including a plurality of thin film transistors disposed on said light transmission substrate;
a first light-shielding film disposed between said light transmission substrate and at least one of said thin film transistors;
a second light-shielding film disposed between said first light-shielding film and an active layer of said thin film transistor,
wherein a carrier concentration of a surface portion of said second light-shielding film which opposes said active layer is about $10^{17}/cm^3$ or less.

12. The thin film transistor substrate according to claim 11,
further comprising pixel electrodes corresponding to each of said plurality of thin film transistors,
wherein each of said pixel electrode is driven by a thin film transistor which said pixel electrode corresponds to.

13. The thin film transistor substrate according to claim 12, wherein a dielectric film in between capacitance electrodes is connected to said pixel electrodes in parallel.

14. The thin film transistor substrate according to claim 13,
further comprising another thin film transistor which comprises neither said first light-shielding film nor said second light-shielding film.

15. The thin film transistor substrate according to claim 11,
wherein an electric field intensity of a surface portion of said second light-shielding film which opposes said active layer includes about 80% or less of that of a surface portion of said second light-shielding film which opposes said first light-shielding film.

16. The thin film transistor substrate according to claim 11,
wherein said second light-shielding film is made of
a material selected from a group consisting of amorphous silicon, crystallite silicon, amorphous Silicon Germanium, poly germanium, amorphous germanium, poly Silicon Germanium, and any combination thereof.

17. A liquid crystal display unit comprising:
a thin film transistor substrate according to claims 11;
an opposite substrate disposed to oppose said thin film transistor substrate; and
a liquid crystal layer disposed between said thin film transistor substrate and said opposite substrate.

* * * * *